(12) United States Patent
Wu (10) Patent No.: US 6,251,731 B1
(45) Date of Patent: *Jun. 26, 2001

(54) METHOD FOR FABRICATING HIGH-DENSITY AND HIGH-SPEED NAND-TYPE MASK ROMS

(75) Inventor: Shye-Lin Wu, Hsinchu (TW)

(73) Assignee: Acer Semiconductor Manufacturing, Inc., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 09/351,873

(22) Filed: Jul. 13, 1999

Related U.S. Application Data

(63) Continuation-in-part of application No. 09/131,492, filed on Aug. 10, 1998.

(51) Int. Cl.[7] .................... H01L 21/8234; H01L 21/336; H01L 21/338
(52) U.S. Cl. .......................... 438/275; 438/279; 438/183; 438/278
(58) Field of Search .................... 438/275, 276, 438/278, 279, 183

(56) References Cited

U.S. PATENT DOCUMENTS 5,710,073 * 1/1998 Jeng et al. ..................... 438/239
5,747,359 * 5/1998 Yuan et al. ..................... 437/186
6,048,765 * 4/2000 Wu ..................... 438/257
6,057,195 * 5/2000 Wu ..................... 438/275
6,091,119 * 7/2000 Wu ..................... 257/390

* cited by examiner

Primary Examiner—Richard Elms
Assistant Examiner—Adam Pyonin (57) ABSTRACT

The present invention proposes a method for fabricating high-density and high-speed NAND-type mask read-only memories. This method constructs the doped sources and drains by dopant diffusion into the silicon substrate to form ultra-shallow junction, and therefore minimizes the punch-through issue. First, a stacked thin oxide, doped silicon and silicon nitride layer is deposited on the semiconductor substrate and then bit line regions is defined. Gate oxide film is formed between the bit line regions and the dopants in the silicon layer are driven into the substrate to form shallow junctions for source and drain regions. A doped polysilicon layer is deposited on the substrate and a chemical mechanical polishing process is carried out with the silicon nitride as the stopping layer. A coding implantation is performed and a conductive layer is defined on the polysilicon layer to be the word lines. A high temperature annealing is carried out to form polycide in the word line regions, thereby finishing the fabrication.

21 Claims, 6 Drawing Sheets

METHOD FOR FABRICATING HIGH-DENSITY AND HIGH-SPEED NAND-TYPE MASK ROMS

CROSS REFERENCE TO RELATED APPLICATIONS

This is a continuation-in-part of U.S. patent application Ser. No. 09/131,492, filed Aug. 10, 1998.

This invention is a continuation-in-part application filed with a Ser. No. 09/131,492 titled "HIGH-DENSITYANDHIGH-SPEEDNAND-TYPE MASK ROMS", and assigned to same assignee with the same inventor as the present application.

FIELD OF THE INVENTION

The present invention relates to a method for fabricating a semiconductor device, and more especially, to a method for fabricating NAND-type mask ROMs.

BACKGROUND OF THE INVENTION

Read-only memories (ROMs), which are nonvolatile memories and retain their memory data whenever the power is turned off, have wide applications in the computer and electronic industry. In recent years, the portable computers and telecommunications market develop rapidly and become a major driving force in semiconductor integrated circuit's design and technology. It creates a great need of high density and high speed read-only memories for notebook computers, mobile phones, portable CD players and so on. These read-only memories are required for above systems to store permanent programs such as operating systems or applications software instead of conventional mass storage equipment.

As one of the basic nonvolatile memories, mask read-only memories (mask ROMs) is preferred for mass production but is not reprogrammable. In general, mask ROM devices are constructed by memory cells for coding data and periphery controlling devices to control the operation of the cells. Each bit of data is stored in a cell, which is usually a single N-channel transistor. There are two types of ROM array referred as NOR type array and NAND type array for storing data. The NOR type ROM array consists of a set of MOS transistors connected in parallel to bit lines and has high speed operation but low bit density due to the large cell size resulting from the need of a bit line contact to every cell. The NAND type ROM structure, in which MOS transistors connected in series and has only one bit line contact for a series of cells, can be much smaller in area and exhibits higher packing density since there are no contact hole required in each array cell.

In general, mask ROM includes MOS devices with different threshold voltage for programming. Typically, the MOS transistors served as memory cells are designed to operate at the same threshold level and usually "ON" or in a logic "1" state. Some of the cell transistors are then programmed to be "OFF" or in a logic "0" state for data writing by raising their threshold voltage. For fabricating the normally "OFF" cell transistors in accordance with the designed storage circuit, a high-dosage opposite-type ion implantation into the channel regions can be adopted to increase the threshold voltage and therefore change the logic state from "1" to "0". The doped regions are usually referred as coding regions. Alternatively, selective thickening of the gate oxide or selective through-hole contact opening can replace the coding implantation to be the chosen programming method. Furthermore, the data writing can also be achieved by changing the transistors from enhancement mode to depletion mode.

In the U.S. Pat. No. 5,406,511 titled "MASK ROM FOR STORING PLURAL-BIT DATA", K. Nogami illustrated two top view figures of synoptic layout to mask ROM cell structures for both NOR type and NAND type arrays. K. Tasaka illustrated in U. S. Pat. No. 5,610,092 titled "METHOD FOR FABRICATING LARGE CAPACITY NAND TYPE ROM WITH SHORT MEMORY CELL GATE LENGTH" that the cross-sectional view figures for conventional mask ROM's manufacturing processes. But as stated by C. C. Hsue, et al., in the U.S. Pat. No. 5,668,031 entitled "METHOD OF FABRICATING HIGH DENSITY FLAT CELL MASK ROM", the mask ROM wafer with all MOS transistors built in will undergo several high temperature processes. Each high temperature process could cause the diffusion of impurities in areas such as the buried bit lines so that the spaces between two adjacent bit lines will become narrow and that will induce cell punch-through. As the need and technique of memory devices trend to high density and therefore decrease of memory cell, to diminish the spaces between source and drain electrodes or between to adjacent bit lines are necessary. The punch-through problem between two impurity areas will thus become more and more serious.

SUMMARY OF THE INVENTION

A method for fabricating high-density and high-speed NAND-type mask read-only memories is disclosed. This method utilizes an anti-reflective coating for improving the exposure accuracy. Polycide is created in the word line regions to lower the word line resistance. In addition, the present invention constructs the doped sources and drains by dopant diffusion into the silicon substrate to form ultra-shallow junction, and therefore minimizes the punch-through issue between adjacent bit lines.

First, a stacked thin oxide, doped silicon and silicon nitride layer is deposited on the semiconductor substrate and then bit line regions is defined by a standard photolithography process followed by an anisotropic etching. Gate oxide film is formed between the bit line regions and the dopants in the doped silicon layer are driven into the substrate to form shallow junctions for source and drain regions. A doped polysilicon layer is deposited on the substrate and then a chemical mechanical polishing process is carried out with the silicon nitride as the stopping layer. A coding implantation is performed to selectively adjust the threshold voltage of predetermined coding regions. Therefore, a conductive layer is formed on the polysilicon layer and then defined to be the word line regions. A high temperature annealing is carried out to form polycide in the word line regions, the memory is thus finished.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The present invention proposes a novel method for fabricating high-density and high-speed NAND-type mask read-only memories devices. The method described here includes many process steps that are well known in the art like photolithography, etching or chemical vapor deposition (CVD), which are not discussed in detail. An anti-reflective coating of silicon nitride is utilized for improving the exposure accuracy. Polycide is created in the word line regions to lower the word line resistance. In addition, the present invention constructs the doped sources and drains by dopant diffusion into the silicon substrate to form ultra-shallow junction, and therefore minimizes the punch-through issue between adjacent bit lines. The manufacturing process are described as follows.

Figure 1:
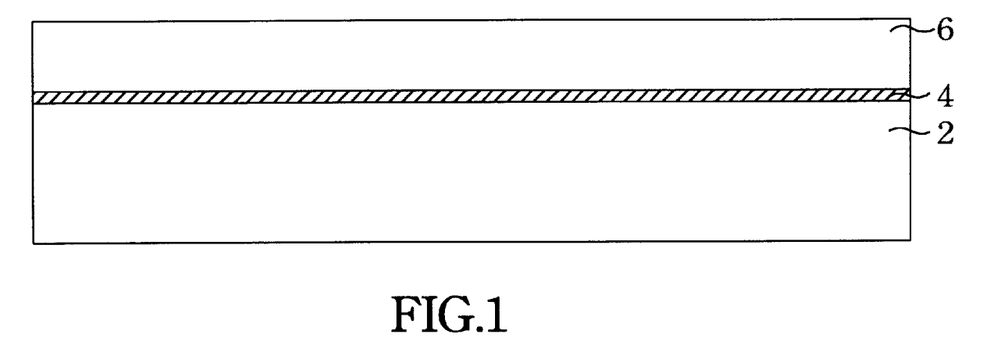
FIG. 1 is a cross-sectional view of a semiconductor wafer illustrating the step of forming a thin oxide layer and a doped silicon layer on the substrate according to the present invention.

Referring to FIG. 1, a single crystal substrate with a <100> crystallographic orientation is used for the preferred embodiment. Isolation regions, which are not shown in the following figures, are created for the purposes of isolation. In a case, FOX (field oxide) regions are created to achieve the purpose. Typically, the memory device includes a cell area surrounded by a periphery area consisting of n-channel transistors. The cell area includes a multiplicity of ROM transistors. Therefore, the first step of the present invention is to create transistors on the substrate 2 both in the cell area and in the periphery area.

A thin oxide layer 4 is first formed on the substrate 2 by using an oxygen-steam ambient, at a temperature of about 800 to 1100 degrees centigrade. Alternatively, the thin oxide 4 may be formed using other known oxide chemical compositions and procedures. For example, low pressure chemical vapor deposition (LPCVD) can be applied to form a deposited oxide layer. A native oxide film can also be utilized instead of the fabricated oxide film. In the preferred embodiment, the thickness of the thin oxide layer 4 is about 10–30 angstroms.

After the thin oxide layer 4 is formed, silicon layer 6 having heavy n type conductive dopant (n+) is deposited on the thin oxide layer 4 using chemical vapor deposition followed by an n type impurity doping. The silicon layer 6 can be formed of either amorphous silicon or polysilicon by a process of low pressure chemical vapor deposition (LPCVD) at a temperature respectively of about 400–560° C. or 575–650° C. Then, an ion implantation 6 is performed, and high dose impurity ions of the designed channel conductive type are doped into the silicon layer 6. For n-type MOS transistor devices, the doping ions are selected to be phosphoric ions, arsenic ions or antimony ions. The dose employed is in the range of about $5 \times 10^{14}$ to $5 \times 10^{16}$ ions/cm$^2$ and energy of about 10–150 keV. Alternatively, an in-situ doping process can be carried out while the silicon layer 6 is deposited.

Figure 2:
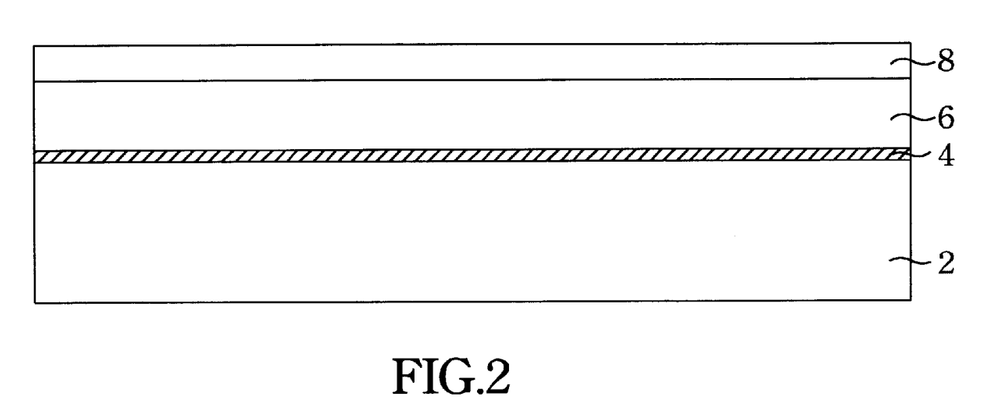
FIG. 2 is a cross-sectional view of a semiconductor wafer illustrating the step of forming a silicon nitride layer on the substrate according to the present invention.

A silicon nitride layer 8 is then deposited on the silicon layer 6 as shown in FIG. 2. The silicon nitride layer 8 is used to serve as an anti-reflective coating (ARC) for subsequent photolithography technology to define short channel bit line regions. In general, the silicon nitride layer 8 can be deposited by any suitable process such as low pressure chemical vapor deposition (LPCVD), plasma enhance chemical vapor deposition (PECVD), or electron cyclotron remote chemical vapor deposition (ECRCVD). The thickness of the silicon nitride layer is about 300 to 1000 angstroms. Further, the temperature to form the silicon nitride layer 8 is at a range of about 300–800° C. In a preferred embodiment, the reaction gases of the step to form silicon nitride layer 8 are $SiH_4$, $NH_3$, $N_2$, $N_2O$ or $SiH_2Cl_2$, $NH_3$, $N_2$, $N_2O$. The application of silicon nitride layer for anti-reflective coating was investigated by T. P. Ong, et al., in "CVD $SiN_x$ Anti-Reflective Coating for Sub-0.5 $\mu$m Lithography" in Symposium on VLSI Tech. Dig., p. 73, 1995.

Figure 3:
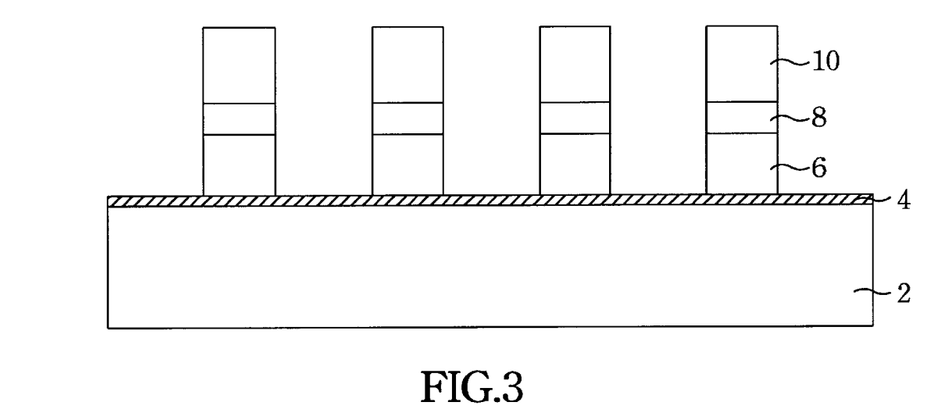
FIG. 3 is a cross-sectional view of a semiconductor wafer illustrating the step of defining the bit line regions according to the present invention.

Turning next to FIG. 3, the silicon nitride layer 8 and the doped silicon layer 6 are patterned to define the bit line regions on the substrate 2 by using photoresist 10 as an etching mask. The photoresist 10 is formed on the silicon nitride layer 8 by using a standard manner of photolithography including photoresist coating, exposure and development processes. The silicon nitride layer 8, which is used to improve the accuracy of the photoresist exposure, is patterned by a reactive ion etching (RIE) with plasma gases containing fluoride such as $CF_4/O_2$, $CF_2/H_2$, $CHF_3$ or $NF_3$. Another dry etching using $Cl_2$, $BCl_3$, HBr, $SF_6$ or $SiCl_4$ as the plasma source can be employed for silicon patterning. The patterned silicon layer 6 is used to define and cover the bit line regions of the mask ROM.

Figure 4:
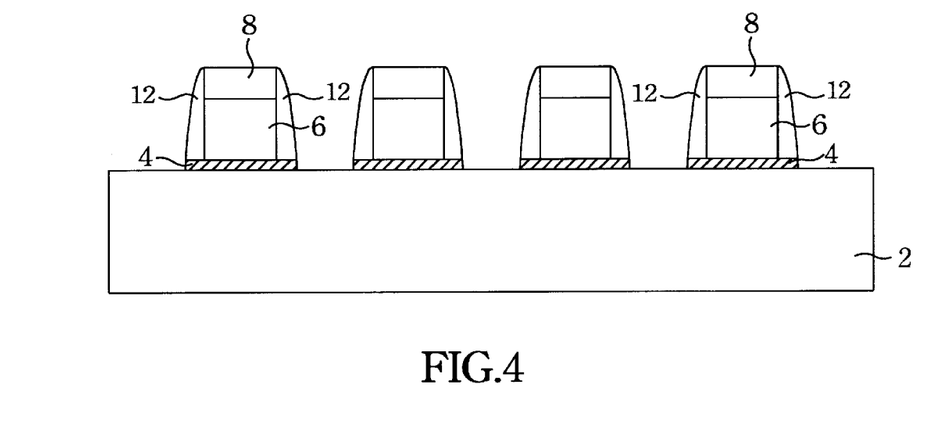
FIG. 4 is a cross-sectional view of a semiconductor wafer illustrating the step of forming nitride spacers on the sidewalls of the doped silicon layer according to the present invention.

Next, please refer to FIG. 4, the photoresist 10 is stripped by conventional manner. Dielectric spacers 12 are then formed on the sidewalls of the patterned silicon layer 6 and silicon nitride layer 8 by means of depositing a dielectric layer then etching back by an anisotropic etching. A dielectric material of silicon nitride or silicon oxide can be employed for these dielectric spacers 12. Moreover, at this step, the thin oxide layer 4 is simultaneously etched to expose portions of the substrate 2 between two bit line regions.

Figure 5:
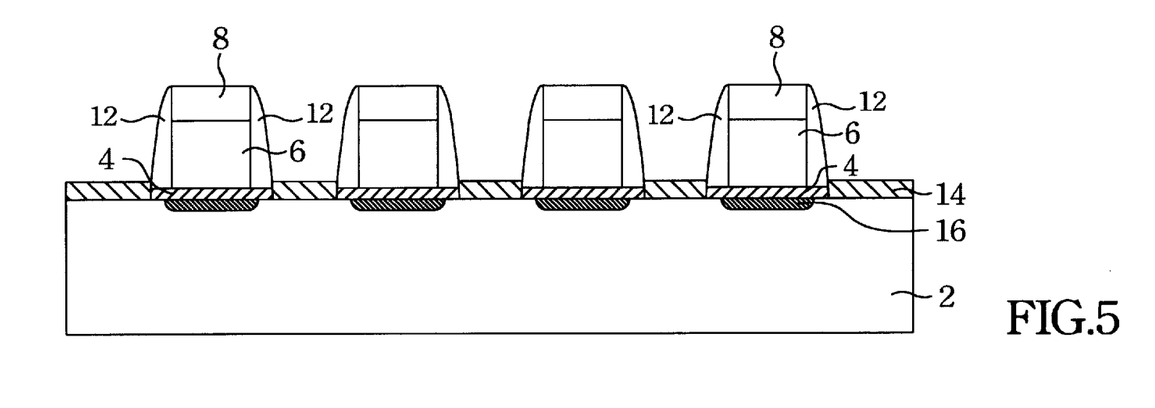
FIG. 5 is a cross-sectional view of a semiconductor wafer illustrating the step of forming a gate oxide layer on the substrate according to the present invention.

Thereafter, a gate oxide film 14 is regrown on the exposed portions of the substrate 2 not covered by the silicon layer 6 and the dielectric spacers 12 (that is, between two bit line regions) as shown in FIG. 5. This gate oxide film 14 is grown with a thickness of about 15 to 200 angstroms by using a thermal oxidation process at a temperature of about 800 to 1100 degrees centigrade. An NO or $N_2O$ environment can be used for this thermal oxidation, and the gate oxide film 14 will consist of material of oxynitride when NO or $N_2O$ environment is employed. The etching damages are recovered by this high temperature thermal process. Furthermore, the n type dopants in the patterned silicon layer 6 are driven into the substrate and form ultra-shallow junctions. Doped source and drain regions 16 are thus formed in the substrate 2 beneath the patterned silicon layer 6 between the gate oxide film 14. The thin oxide layer 4 is used here as a buffer.

Figure 6:
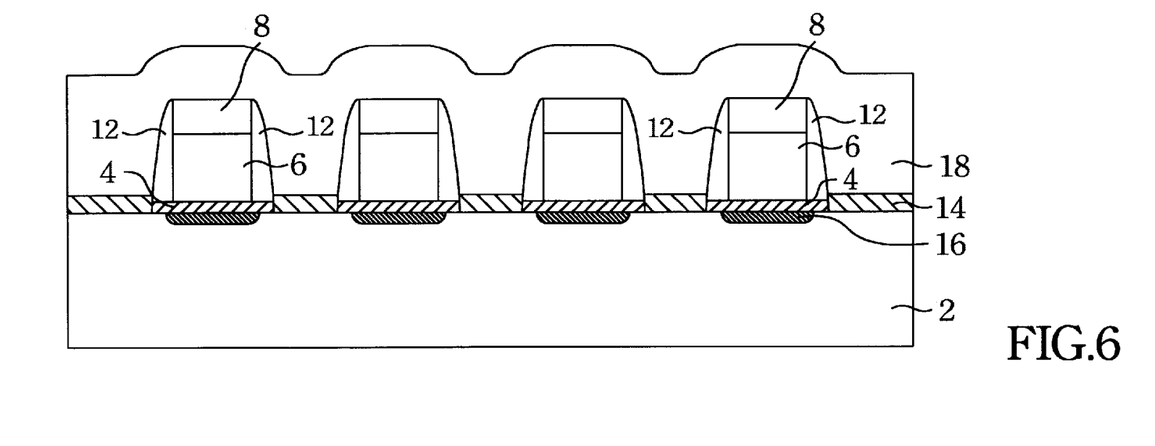
FIG. 6 is a cross-sectional view of a semiconductor wafer illustrating the step of forming a polysilicon layer on the substrate and then implanting with high dose impurities according to the present invention.

Turning next to FIG. 6, a doped or in-situ doped polysilicon layer 18 is deposited on the substrate 2 by using chemical vapor deposition process. For a doped polysilicon layer, $POCl_3$ or $P_2O_5$ can be employed as the dopants. For an in-situ doped polysilicon layer, $PH_3$ or $AsH_3$ can be employed as the dopants. This polysilicon layer 18 is mainly formed on the gate oxide film 14 between the silicon layer 6 and the dielectric spacers 12 to serve as the gate electrodes.

Figure 7:
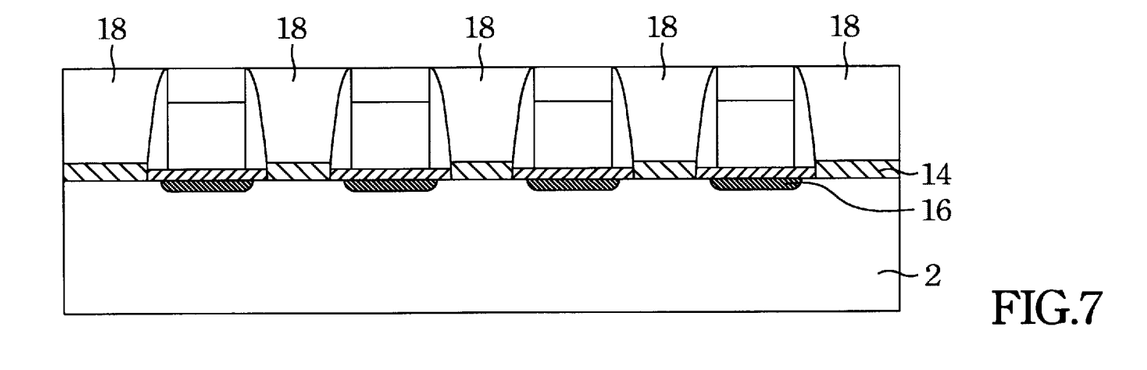
FIG. 7 is a cross-sectional view of a semiconductor wafer illustrating the step of performing a CMP process to planarize the polysilicon layer according to the present invention.

As shown in FIG. 7, the polysilicon layer 18 is then etched back by using a chemical mechanical polishing (CMP). At this planarization step, the silicon nitride layer 8 serves as a stopping layer. The portion of the polysilicon layer 18 above the silicon nitride layer 8 is removed and the global planarization can be achieved. The remaining portions of the polysilicon layer 18 are separated from each other to serve as gate electrodes of the individual transistors.

Figure 8:
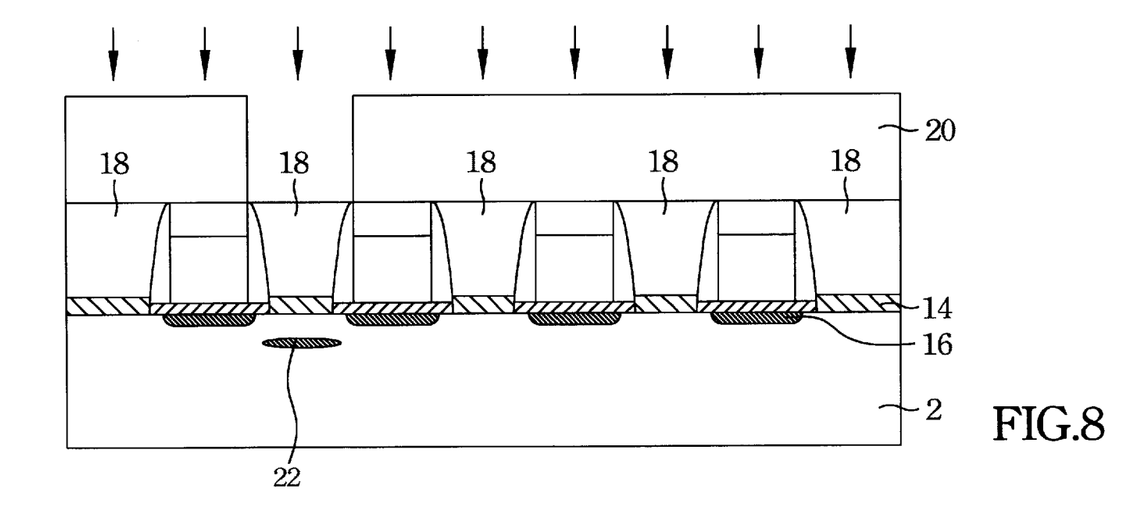
FIG. 8 is a cross-sectional view of a semiconductor wafer illustrating the step of performing a coding implantation according to the present invention.

For fabricating the normally "OFF" cell transistors in accordance with the designed storage circuit, a coding implantation is carried out to adjust the threshold voltage of predetermined coding regions for designed NAND array. To achieve that, a photoresist 20 is patterned on the substrate 2 for defining the coding regions 22 by masking on all other areas. A heavy dosage of ion implantation is performed to implant the doping ions into the channel regions not covered by the photoresist 20. The conductive type of these doping ions should be opposite to the designed channel type and therefore increase the threshold voltage of the coding devices. In general, the channel conductive type is n-type and the doping ions are p-type ions such as boron ion or $BF_2^+$. The coding cells are forced into an "off" state permanently in the normal operation level. The dose and energy used by this coding implantation are about $5\times10^{11}$ to $1\times10^{15}$ ions/cm$^2$ and 80 to 300 keV respectively. The resulting coding regions 22 and the patterned photoresist 20 are shown in FIG. 8. The arrows indicate the implanting direction.

Figure 9:
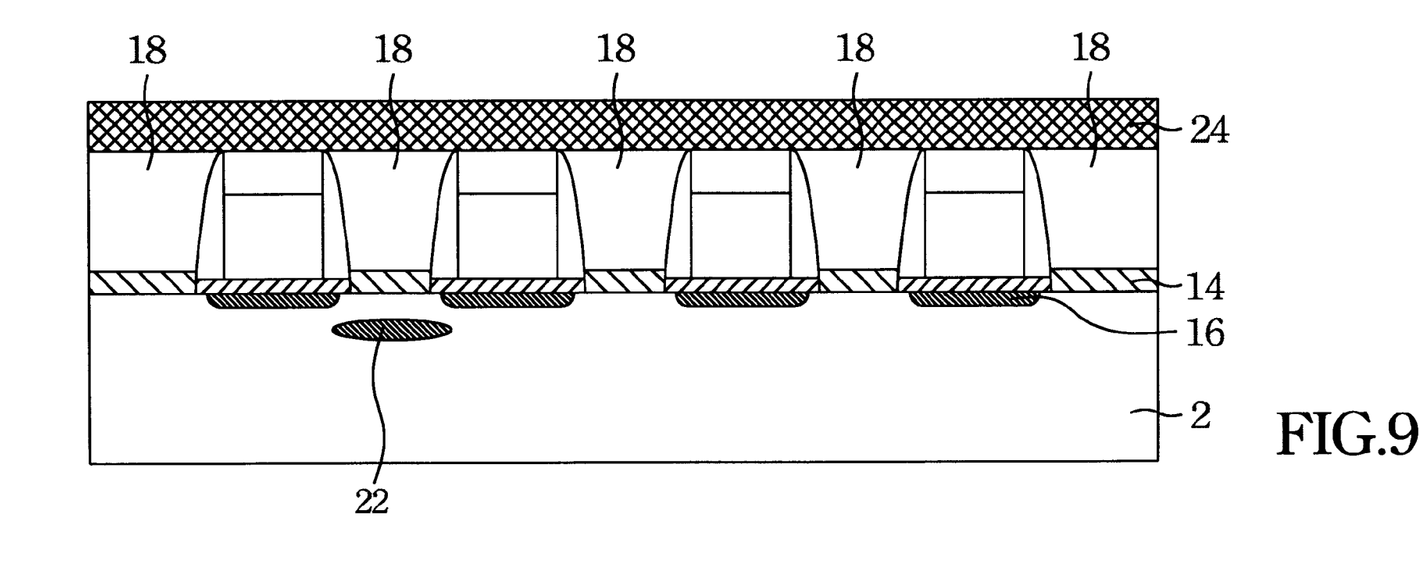
FIG. 9 is a cross-sectional view of a semiconductor wafer illustrating the step of depositing a conductive layer on the substrate and performing a high temperature annealing according to the present invention.

The word line regions 24 are now defined on the substrate as shown in FIG. 9 by next two steps. First, a conductive film is deposited on the substrate. This conductive layer, which will serve as word lines after patterning, is preferably formed of metal materials such as titanium (Ti), tungsten (W), cobalt (Co), platinum (Pt) or Nickel (Ni) and so on. In addition, metal silicide like $WS_2$ can be another suitable choice for this conductive layer. The word line pattern is then defined by a photolithography process followed by an anisotropic etching.

Finally, a high temperature annealing process is carried out at a temperature of about 800–1100° C. At this step, the dopants in the coding regions and the source and drain regions are activated to get a better distribution. Simultaneously, polycide is formed between the polysilicon layer 18 and word line regions 24 to reduce the word line resistance, and the operation speed is therefore increased. The shallow junctions of the source and drain regions can make sure that the punch-through issue raised in subsequent high temperature process can be avoided.

Figure 10:
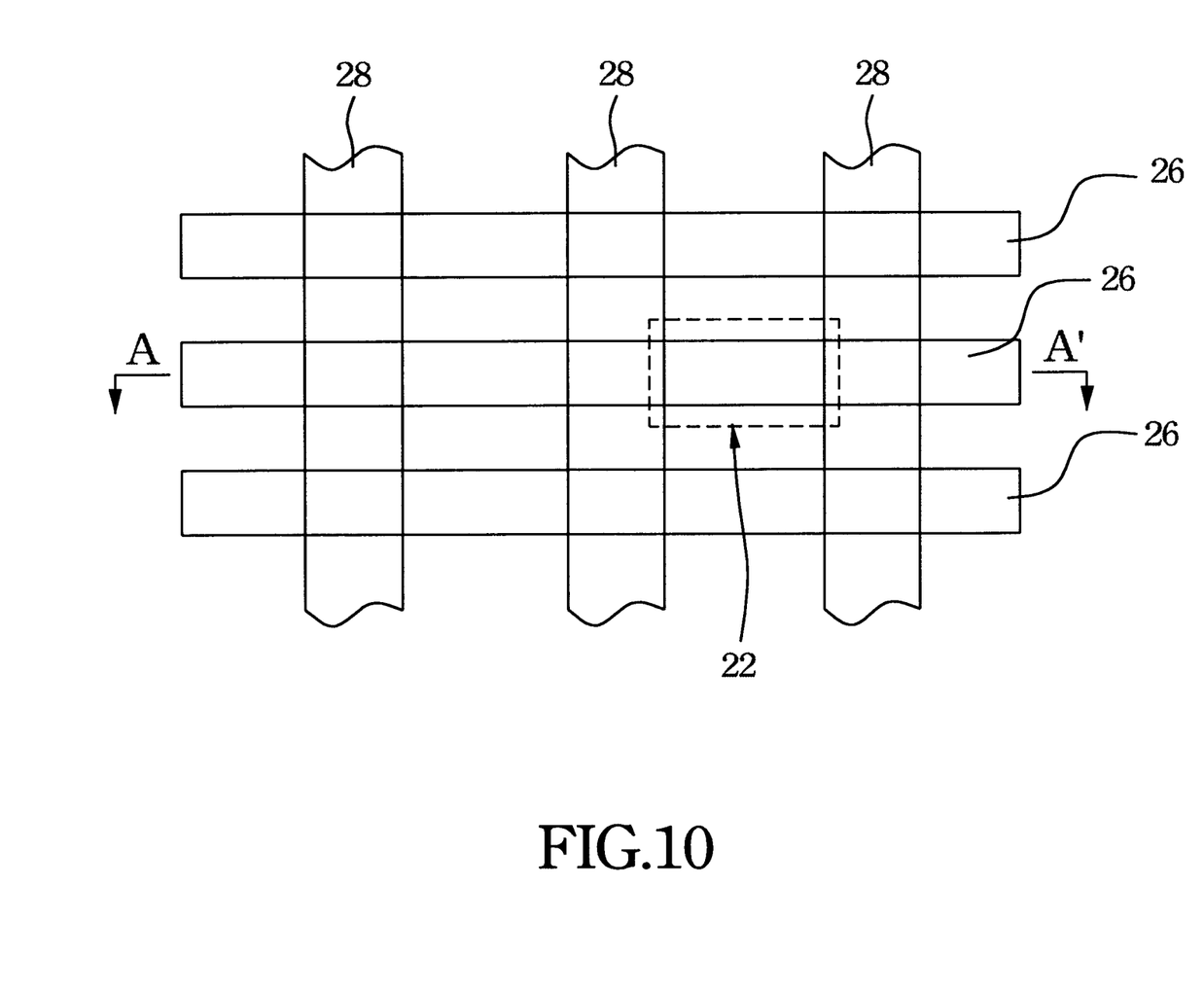
FIG. 10 is a top view of the high-density NAND-type mask ROM of the present invention.

FIG. 10 shows the top view of the high-density/speed NAND-type mask read-only memories of the present invention. Regions 26 represent the word lines including gate electrodes 18 and gate oxides 14. The regions 28, which are marked with numeral 16 in the foregoing figures, represent the bit line pattern. The AA' cross section is illustrated in FIG. 1 to FIG. 9 for the manufacturing formulation of the present NAND-type mask read-only memories.

The present invention provides a novel method to fabricate NAND-type mask read-only memories with high density and high speed. The use of silicon nitride for anti-reflective coating improves the exposure accuracy while gate structures are defined and thus increases the integration of devices to achieve high package density. The impurity dopants diffused from silicon layer into substrate forms ultra-shallow junctions for source and drain regions of the devices. The punch-through problem between adjacent bit lines raised from impurity diffusion caused by subsequent high temperature process can thus be minimized. The polycide formed in word line regions can reduce the word line resistance, and the operation speed is therefore increased. High-density and high-speed mask ROMs are thus built without punch-through problem according to the present invention.

As is understood by a person who is skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A method for forming mask read-only memories, the method comprising:

providing a semiconductor substrate;

forming a silicon layer on said semiconductor substrate, wherein said silicon layer is doped with first conductive type impurities;

patterning said silicon layer to define bit line regions;

forming dielectric spacers on the sidewalls of said patterned silicon layer;

forming a gate oxide layer on the exposed portion of said semiconductor substrate not covered by said patterned silicon layer and said dielectric spacers; and forming a polysilicon layer on said gate oxide layer to serve as gate electrodes.

2. The method according to claim 1, further comprising a step to form a silicon oxide layer having a thickness of about 10–30 angstroms on said semiconductor substrate before said silicon layer is formed.

3. The method according to claim 1, wherein said silicon layer is formed of a material selected from the group consisting of amorphous silicon and polysilicon.

4. The method according to claim 1, wherein said first conductive type impurities are n-type impurities selected from the group consisting of phosphorus ions, arsenic ions and antimony ions, and said n-type impurities are doped with dosage of about $5\times10^{14}$ to $5\times10^{16}$ atoms/cm$^2$.

5. The method according to claim 1, further comprising a step to form a silicon nitride layer having a thickness of about 300 to 1000 angstroms on said silicon layer before said silicon layer is patterned, wherein said silicon nitride layer is covered with a portion of said silicon nitride layer.

6. The method according to claim 5, further comprising a step to remove the portion of said polysilicon layer.

7. The method according to claim 6, wherein said polysilicon layer is removed by a chemical mechanical polishing (CMP) process.

8. The method according to claim 1, wherein said dielectric spacers are formed of the group consisting of silicon oxide and silicon nitride.

9. The method according to claim 1, wherein said dielectric spacers are formed by following method:
   depositing a dielectric film on said semiconductor substrate; and
   etching said dielectric film anisotropically.

10. The method according to claim 1, wherein said gate oxide layer is formed by a thermal oxidation, thereby said first conductive type impurities in said silicon layer are driven into said semiconductor substrate to form source and drain regions simultaneously.

11. The method according to claim 10, wherein said thermal oxidation is performed in an environment selected from the group consisting of NO and $N_2O$ at a temperature of about 800 to 1100 degrees centigrade.

12. The method according to claim 1 further comprising following steps to form coding regions in said semiconductor substrate:
   patterning a photoresist on said semiconductor substrate to define said coding regions by covering all other areas but exposing said coding regions; and
   implanting second conductive type ions into said coding regions of said semiconductor substrate.

13. The method according to claim 12, wherein said second conductive type ions are p-type ions selected from the group consisting of boron ions, and $BF_2$, and said p-type ions are implanted at about 80 to 300 keV with dosage of about $5\times10^{11}$ to $1\times10^{15}$ atoms/cm$^2$.

14. The method according to claim 1, further comprising a step to form a conductive layer on said polysilicon layer to define word lines.

15. The method according to claim 14, wherein said conductive layer is formed of a material selected from the group consisting of metal and silicide.

16. The method according to claim 15, wherein said metal is consisting of titanium (Ti), tungsten (W), cobalt (Co), platinum (Pt) and Nickel (Ni).

17. The method according to claim 15, further comprising a thermal annealing performed at a temperature of about 800 to 1100° C. to form polycide between said polysilicon layer and said conductive layer, thereby said first conductive type impurities in said silicon layer are driven into said semiconductor substrate to form source and drain regions.

18. A method for forming mask read-only memories, the method comprising:
   providing a semiconductor substrate;
   forming a silicon layer on said semiconductor substrate, wherein said silicon layer is doped with first conductive type impurities;
   forming a silicon nitride layer on said silicon layer;
   patterning said silicon nitride layer and said silicon layer to define bit line regions, whereby said patterned silicon layer has sidewalls;
   forming dielectric spacers on the sidewalls of said patterned silicon layer, whereby said semiconductor substrate is partially covered with said dielectric spacers and said patterned silicon layer
   performing a thermal oxidation to forming a gate oxide layer on the non-covered portion of said semiconductor substrate thereby said first conductive type impurities in said silicon layer are driven into said semiconductor substrate to form source and drain regions simultaneously;
   forming a polysilicon layer on said semiconductor substrate to serve as gate electrodes.

19. The method according to claim 18, further comprising a step to form a silicon oxide layer on said semiconductor substrate before said silicon layer is formed, wherein said silicon oxide layer has a thickness of about 10–30 angstroms.

20. The method according to claim 18, further comprising a step to form a conductive layer on said polysilicon layer to define word lines.

21. A method for forming mask read-only memories, the method comprising:
   forming a silicon oxide layer on a semiconductor substrate;
   forming silicon layer on said silicon oxide layer, wherein said silicon layer is doped with first conductive type impurities;
   forming a silicon nitride layer on said silicon layer;
   patterning said silicon nitride layer and said silicon layer to define bit line regions;
   forming dielectric spacers on the sidewalls of said patterned silicon layer;
   performing a thermal oxidation to form a gate oxide layer on the exposed portion of said semiconductor substrate not covered by said patterned silicon layer and said dielectric spacers, thereby said first conductive type impurities in said silicon layer are driven into said semiconductor substrate to form source and drain regions simultaneously;
   forming a polysilicon layer over said silicon nitride layer on said semiconductor substrate, whereby said polysilicon layer has a portion above said silicon nitride layer;
   removing the portion of said polysilicon layer above said silicon nitride layer;
   implanting second conductive type impurities into said semiconductor substrate to form coding regions in said semiconductor substrate; and forming a conductive layer on said polysilicon layer to define word lines.

* * * * *